United States Patent
Miyazaki et al.

(10) Patent No.: US 11,946,986 B2
(45) Date of Patent: Apr. 2, 2024

(54) MAGNETIC DETECTOR, DETECTION METHOD, AND NON-TRANSITORY COMPUTER READABLE STORAGE MEDIUM

(71) Applicant: FUJIDENOLO CO., LTD., Komaki (JP)

(72) Inventors: Hideki Miyazaki, Komaki (JP); Kazuya Kimura, Komaki (JP)

(73) Assignee: FUJIDENOLO CO., LTD., Komaki (JP)

( * ) Notice: Subject to any disclaimer, the term of this patent is extended or adjusted under 35 U.S.C. 154(b) by 182 days.

(21) Appl. No.: 17/706,986

(22) Filed: Mar. 29, 2022

(65) Prior Publication Data

US 2022/0221529 A1 Jul. 14, 2022

Related U.S. Application Data

(63) Continuation of application No. PCT/JP2019/038538, filed on Sep. 30, 2019.

(51) Int. Cl.
*G01R 33/02* (2006.01)
*G01R 33/022* (2006.01)

(52) U.S. Cl.
CPC ....... *G01R 33/0206* (2013.01); *G01R 33/022* (2013.01)

(58) Field of Classification Search
CPC .............. G01R 33/0206; G01R 33/022; G01R 33/0094; G01R 33/0029; G01R 33/063; G01R 33/12; G01V 3/081

(Continued)

(56) References Cited

U.S. PATENT DOCUMENTS 7,342,399 B1 3/2008 Wiegert
8,575,929 B1 11/2013 Wiegert
(Continued)

FOREIGN PATENT DOCUMENTS

EP 3537098 A1 9/2019
FR 2988862 A1 10/2013
(Continued)

OTHER PUBLICATIONS

International Preliminary Report on Patentablity for International Application No. PCT/JP2019/038538, which includes English translation of Written Opinion of the International Searching Authority for No. PCT/JP2019/038538 dated Dec. 3, 2019.
(Continued)

*Primary Examiner* — Farhana A Hoque
(74) *Attorney, Agent, or Firm* — Muncy, Geissler, Olds & Lowe, P.C.

(57) ABSTRACT

A magnetic detector comprises a first magnetic sensor configured to measure a first magnetic field component, a second magnetic sensor configured to measure a possible magnetic field component, a processor, and a memory configured to store a program. The program comprises closest proximity detection processing of detecting a timing at which the magnetic body passes a closest proximity position, closest proximity position component acquisition processing of acquiring the first magnetic field component measured at the timing and the possible magnetic field component, predetermined position component acquisition processing of acquiring the first magnetic field component when the magnetic body is at a predetermined position, distance estimation processing of estimating a third direction distance, and magnetic moment amount estimation processing of estimating a magnitude of the magnetic moment.

18 Claims, 7 Drawing Sheets

(58) Field of Classification Search
USPC .......................................................... 324/244
See application file for complete search history.

(56) References Cited

U.S. PATENT DOCUMENTS

| | | |
|---|---|---|
| 2002/0171427 A1 | 11/2002 | Wiegert |
| 2008/0084301 A1 | 4/2008 | Roybal |
| 2015/0057969 A1 | 2/2015 | Hautson |
| 2015/0301216 A1 | 10/2015 | Hautson |
| 2019/0079211 A1 | 3/2019 | Keene |
| 2019/0094043 A1 | 3/2019 | Miyazaki |
| 2019/0257789 A1* | 8/2019 | Miyazaki ............ G01R 33/1223 |

FOREIGN PATENT DOCUMENTS

| | | |
|---|---|---|
| JP | 2002-333484 A | 11/2002 |
| JP | 2007-163469 A | 6/2007 |
| JP | 2012-202781 A | 10/2012 |
| JP | 2015-025692 A | 2/2015 |
| JP | 2019-512088 A | 5/2019 |
| WO | 2018/084278 A1 | 5/2018 |
| WO | 2018/181836 A1 | 10/2018 |

OTHER PUBLICATIONS

Richard J Kozick et al, Algorithms for tracking with an array of magnetic sensors, 2008, IEEE, p. 423-427.

The extended European search report of the corresponding EP application No. 19947952.8 dated May 22, 2023.

English translation of International Search Report of International Application No. PCT/JP2019/038538 dated Dec. 3, 2019.

* cited by examiner

MAGNETIC DETECTOR, DETECTION METHOD, AND NON-TRANSITORY COMPUTER READABLE STORAGE MEDIUM

CROSS-REFERENCE TO RELATED APPLICATIONS

This application is a Continuation Application of International Application No. PCT/JP2019/038538, filed Sep. 30, 2019. The disclosure of the foregoing application is incorporated herein by reference in its entirety.

BACKGROUND

The present disclosure relates to magnetic detector, detection method, and non-transitory computer readable storage medium.

A security system configured to detect a weapon based on a magnetic moment of a magnetic body. The security system is provided with a magnetic sensor that detects a nearby magnetic field. The weapon tends to be a strong magnetic body having a large magnetic moment, and the magnetic moment of the weapon is larger than the magnetic moment of daily commodities. When the magnetic sensor detects the nearby magnetic field formed by the magnetic body, the security system issues an alarm signal based on the magnitude of the detected nearby magnetic field.

SUMMARY

The magnitude of a nearby magnetic field formed by a magnetic moment depends on a distance between a magnetic body and a magnetic sensor, and is subject to an inverse power law with respect to the distance between the magnetic body and the magnetic sensor. In other words, a measurement value of the magnetic sensor may be the same for a strong magnetic body located far from the magnetic sensor and for an object located close to the magnetic sensor and having a small magnetic moment. The security system cannot estimate the position of the magnetic body. Thus, unless the distance between the magnetic body and the magnetic sensor is limited by a physical obstacle, the security system cannot distinguish between a weapon having a large magnetic moment and a daily commodity having a small magnetic moment. Further, even with the weapon having the large magnetic moment, since the magnetic field is attenuated as the separation distance becomes greater, a situation may easily be assumed in which a determination as the weapon is overlooked. Note that the magnetic field formed by the magnetic moment described here is not necessarily limited to a magnetic field arising from a magnetized magnetic body such as a magnet, but also similarly includes a magnetic field formed by a magnetic moment generated as a result of a soft magnetic body or a ferromagnetic body capturing magnetic lines of force of a nearby magnetic field. Weapons such guns and knives are mainly ferromagnetic bodies, namely, objects constituted by iron, and those objects mainly belong to the latter category.

An object of the present disclosure is to provide a magnetic detector, a detection method, and a non-transitory computer readable storage medium capable of accurately estimating the magnitude of a magnetic moment of a magnetic body.

Various embodiments herein provide a magnetic detector configured to detect a magnetic field formed by a magnetic moment of a magnetic body moving in a first direction among the first direction, a second direction, and a third direction, the first direction being a specific direction, and the second direction and the third direction intersecting the first direction. The magnetic detector comprises a first magnetic sensor, a second magnetic sensor, a processor, and a memory. The first magnetic sensor is configured to measure a first magnetic field component, the first magnetic field component being a component of the first direction of the magnetic field. The second magnetic sensor is disposed in close proximity to or integrated with the first magnetic sensor, and is configured to measure a possible magnetic field component including at least one of a second magnetic field component or a third magnetic field component, the second magnetic field component being a component of the second direction of the magnetic field, and the third magnetic field component being a component of the third direction of the magnetic field. The memory is configured to store a program executed by the processor. The program comprises closest proximity detection processing, closest proximity position component acquisition processing, predetermined position component acquisition processing, distance estimation processing and magnetic moment amount estimation processing. The closest proximity detection processing detects a timing at which the magnetic body passes a closest proximity position, the closest proximity position being a position of the magnetic body when the magnetic body moving in the first direction is in closest proximity to the first magnetic sensor. The closest proximity position component acquisition processing acquires the first magnetic field component measured by the first magnetic sensor at the timing and the possible magnetic field component measured by the second magnetic sensor. The predetermined position component acquisition processing acquires the first magnetic field component measured by the first magnetic sensor when the magnetic body is at a predetermined position separated by a predetermined distance from the first magnetic sensor. The distance estimation processing estimates a third direction distance based on the first magnetic field component acquired by each of the closest proximity position component acquisition processing and the predetermined position component acquisition processing, the third direction distance being a distance between the magnetic body and the first magnetic sensor in the third direction. The magnetic moment amount estimation processing estimates a magnitude of the magnetic moment, based on the third direction distance estimated by the distance estimation processing, and on at least one of the first magnetic field component or the possible magnetic field component acquired by the closest proximity position component acquisition processing. Since the magnetic detector can estimate the third direction distance using the sensors that can measure the magnetic field, the magnetic detector can accurately estimate the magnitude of the magnetic moment of the magnetic body based on the third direction distance.

Various embodiments also provide a detection method that estimates a distance between a magnetic body moving in a first direction among the first direction, a second direction, and a third direction and at least one of a first magnetic sensor and a second magnetic sensor, using the first magnetic sensor and the second magnetic sensor, the first direction being a specific direction, the second direction and the third direction intersecting the first direction, and the second magnetic sensor being disposed in close proximity to or integrated with the first magnetic sensor. The first magnetic sensor is configured to measure a first magnetic field component, the first magnetic field component being a component of the first direction of a magnetic field. The second magnetic sensor is configured to measure a possible magnetic field component including at least one of a second magnetic field component or a third magnetic field component, the second magnetic field component being a component of the second direction of the magnetic field, and the third magnetic field component being a component of the third direction of the magnetic field. The detection method comprises a closest proximity detection step, a closest proximity position component acquisition step, a predetermined position component acquisition step, a distance estimation step, and a magnetic moment amount estimation step. The closest proximity detection step detects a timing at which the magnetic body passes a closest proximity position, the closest proximity position being a position of the magnetic body when the magnetic body moving in the first direction is in closest proximity to the first magnetic sensor. The closest proximity position component acquisition step acquires the first magnetic field component measured by the first magnetic sensor at the timing and the possible magnetic field component measured by the second magnetic sensor. The predetermined position component acquisition step of acquires the first magnetic field component measured by the first magnetic sensor when the magnetic body is at a predetermined position separated by a predetermined distance from the first magnetic sensor. The distance estimation step estimates a third direction distance based on the first magnetic field component acquired by each of the closest proximity position component acquisition step and the predetermined position component acquisition step, the third direction distance being a distance between the magnetic body and the first magnetic sensor in the third direction. The magnetic moment amount estimation step estimates a magnitude of the magnetic moment, based on the third direction distance estimated by the distance estimation step, and on at least one of the first magnetic field component or the possible magnetic field component acquired by the closest proximity position component acquisition step.

Various embodiments herein provide a non-transitory computer readable storage medium storing computer readable instructions that are executed by a processor. The computer readable instructions perform steps for estimating a distance between a magnetic body moving in a first direction among the first direction, a second direction, and a third direction and at least one of a first magnetic sensor and a second magnetic sensor, using the first magnetic sensor and the second magnetic sensor, the first direction being a specific direction, the second direction and the third direction intersecting the first direction, and the second magnetic sensor being disposed in close proximity to or integrated with the first magnetic sensor. The first magnetic sensor is configured to measure a first magnetic field component, the first magnetic field component being a component of the first direction of a magnetic field. The second magnetic sensor is configured to measure a possible magnetic field component including at least one of a second magnetic field component or a third magnetic field component, the second magnetic field component being a component of the second direction of the magnetic field, and the third magnetic field component being a component of the third direction of the magnetic field. The steps comprises a closest proximity detection step, a closest proximity position component acquisition step, a predetermined position component acquisition step, a distance estimation step and a magnetic moment amount estimation step. The closest proximity detection step detects a timing at which the magnetic body passes a closest proximity position, the closest proximity position being a position of the magnetic body when the magnetic body moving in the first direction is in closest proximity to the first magnetic sensor. The closest proximity position component acquisition step acquires the first magnetic field component measured by the first magnetic sensor at the timing and the possible magnetic field component measured by the second magnetic sensor. The predetermined position component acquisition step of acquires the first magnetic field component measured by the first magnetic sensor when the magnetic body is at a predetermined position separated by a predetermined distance from the first magnetic sensor. The distance estimation step estimates a third direction distance based on the first magnetic field component acquired by each of the closest proximity position component acquisition step and the predetermined position component acquisition step, the third direction distance being a distance between the magnetic body and the first magnetic sensor in the third direction. The magnetic moment amount estimation step estimates a magnitude of the magnetic moment, based on the third direction distance estimated by the distance estimation step, and on at least one of the first magnetic field component or the possible magnetic field component acquired by the closest proximity position component acquisition step.

According to the second aspect and the third aspect, the same effects as those of the first aspect can be achieved.

BRIEF DESCRIPTION OF THE DRAWINGS

Embodiments of the disclosure will be described below in detail with reference to the accompanying drawings in which.

DETAILED DESCRIPTION

Outline of Magnetic Detector 1

Figure 1:
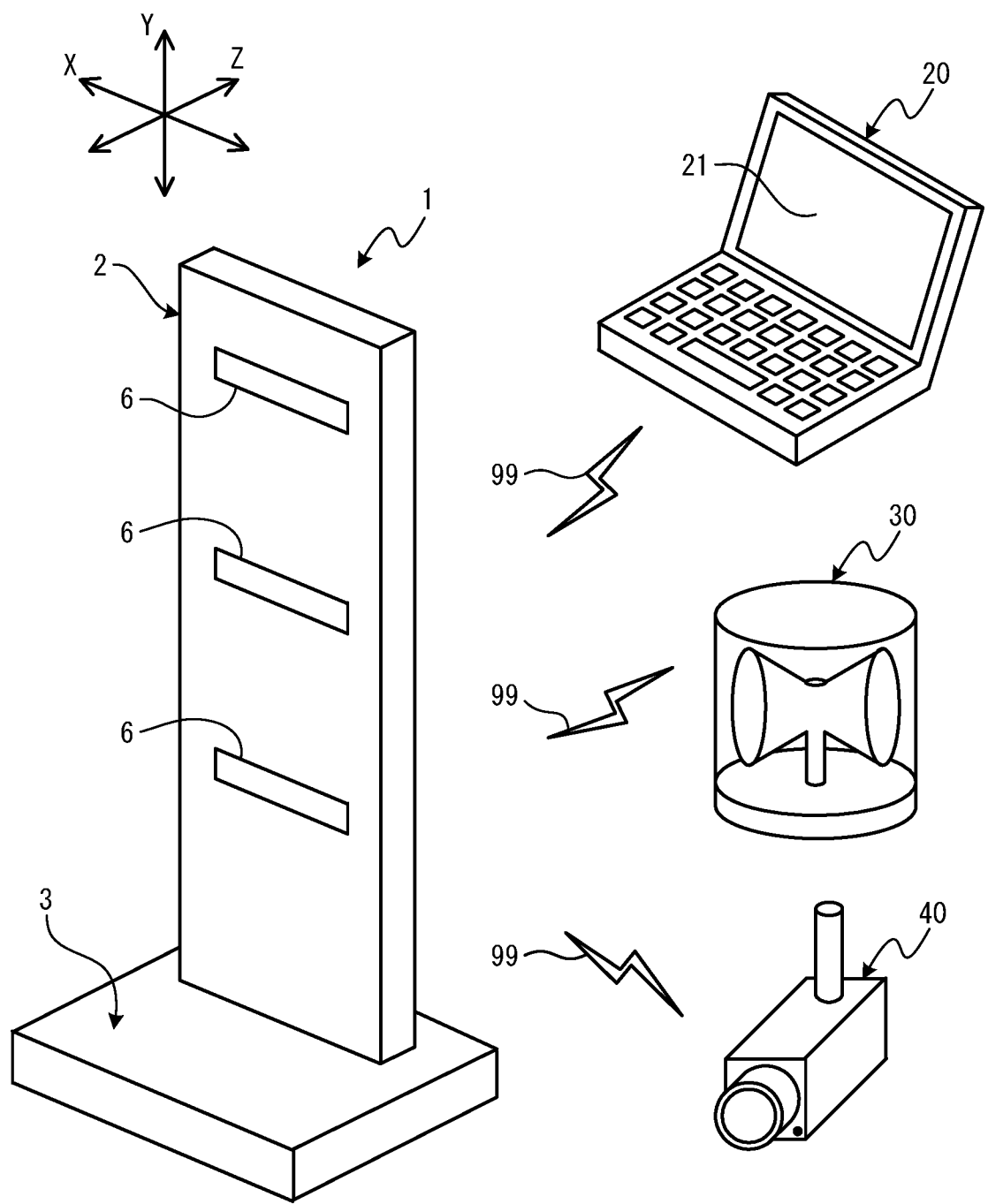
FIG. 1 is an outline of a magnetic detector.

An embodiment of a magnetic detector 1 according to the present disclosure will be described with reference to the drawings. The magnetic detector 1 is a device that can estimate the position of a magnetic body 90 and the magnitude of a magnetic moment of the magnetic body 90. As illustrated in FIG. 1, the magnetic detector 1 is provided with a sensor 2 and a controller 3. The controller 3 has a substantially cuboid shape extending in the horizontal direction. The sensor 2 has a substantially cuboid shape extending upward from the upper surface of the controller 3. The sensor 2 is provided with a plurality of displays 6. The plurality of displays 6 can be lit or caused to flash on and off, and are provided side by side in the vertical direction at the surface of the sensor 2. The magnetic detector 1 can communicate, via a network 99, with a general-purpose personal computer (PC) 20 provided with a display 21, an alarm lamp 30 that can be lit or caused to flash on and off, a monitoring camera 40, and the like.

Electrical Configuration of Magnetic Detector 1

Figure 2:
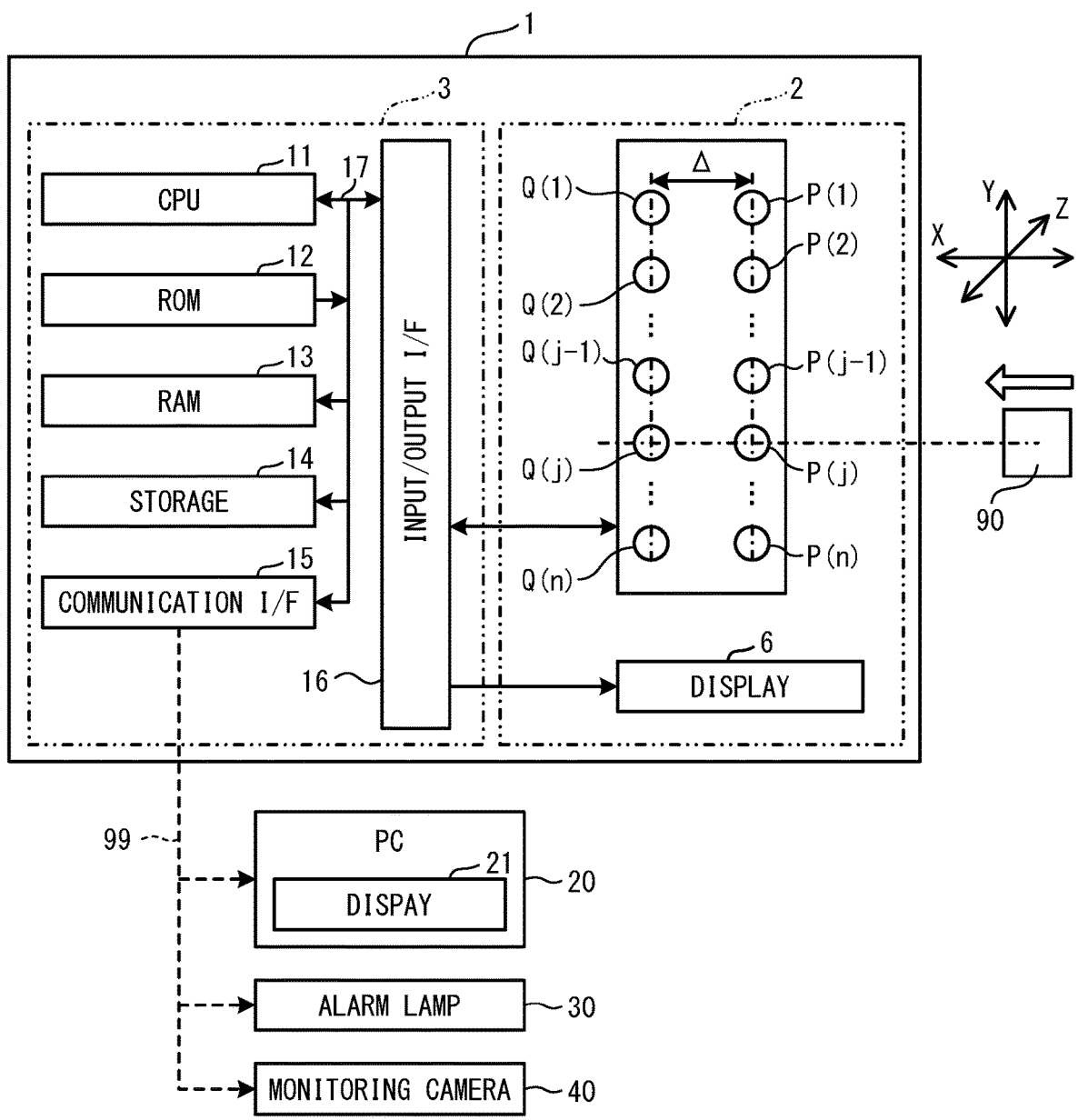
FIG. 2 is an electrical configuration of the magnetic detector.

As illustrated in FIG. 2, the sensor 2 is provided with magnetic sensors P(1), P(2), ... P(n) (n is a natural number) (collectively referred to as "magnetic sensors P"), and magnetic sensors Q(1), Q(2), ... Q(n) (collectively referred to as "magnetic sensors Q"). The magnetic sensors P and Q are each, for example, a known MI sensor that uses a magneto-impedance effect (Magneto-Impedance element, MI effect) in a magnetic amorphous wire.

The magnetic sensors P and Q can selectively measure the magnitude of a component of a specific direction in a magnetic field. Each of the magnetic sensors P and Q is a three-axis sensor (a three dimensional sensor) including three sensors for which directions of measurable components of the magnetic field are orthogonal to each other. In the present embodiment, the directions of the measurable components of the magnetic field by the magnetic sensors P and Q is a three-axis sensor are an X-direction, a Y-direction, and a Z-direction, which are mutually orthogonal. The Y-direction is parallel to the vertical direction. The X-direction and the Z-direction are parallel to the horizontal direction. The magnetic body 90 moves along the X-direction. The magnetic sensors P and Q output, to the controller 3, signals indicating values (hereinafter referred to as "measurement values") indicating the magnitude of the measured component of each of the directions of the magnetic field.

The magnetic sensors P(1), P(2), ... P(n) are disposed side by side in the Y-direction at an equal interval. The magnetic sensors Q(1), Q(2), ... Q(n) are disposed side by side in the Y-direction at an equal interval. A magnetic sensor P(j) (j is a natural number from 1 to n) and a magnetic sensor Q(j) are disposed side by side in the X direction with a predetermined interval interposed therebetween. A distance between the magnetic sensor P(j) and the magnetic sensor Q(j) is denoted by $\Delta$.

The controller 3 is provided with a CPU 11, a ROM 12, a RAM 13, a storage 14, a communication interface (communication I/F) 15, and an input/output interface (input/output I/F) 16. The CPU 11, the ROM 12, the RAM 13, the storage 14, and the communication I/F 15 are electrically connected to the input/output I/F 16 via a data bus 17. The CPU 11 manages control of the magnetic detector 1. The CPU 11 performs main processing (refer to FIG. 5) based on a program stored in the storage 14. In the main processing, the position of the magnetic body 90 and the magnitude of the magnetic moment of the magnetic body 90 are estimated based on the measurement values indicated by the signals output by the magnetic sensors P and Q (hereinafter rephrased as the "measurement values detected by the magnetic sensors P and Q"). The ROM 12 stores various parameters such as threshold values to be described below. The RAM 13 temporarily stores arithmetic results of the CPU 11, a pointer, a counter, a measurement value table to be described below, and the like. The storage 14 is non-volatile and stores various types of programs, and the like. The communication I/F 15 is an interface element for communicating with the PC 20, the alarm lamp 30, and the monitoring camera 40 via the network 99. The input/output I/F 16 is electrically connected to the sensor 2.

Coordinate System

In the magnetic detector 1, a target sensor and a compensation sensor are selected from the magnetic sensors P(1), P(2), ... P(n) and the magnetic sensors Q(1), Q(2), ... Q(n). The target sensor is a magnetic sensor having the shortest distance from the magnetic body 90. The compensation sensor is a magnetic sensor separated from the target sensor in the X-direction by the distance $\Delta$. The magnetic detector 1 estimates the position of the magnetic body 90 and the magnitude of the magnetic moment of the magnetic body 90 using the target sensor and the compensation sensor. In the description below, the target sensor is the magnetic sensor P(j), and the compensation sensor is the magnetic sensor Q(j).

Figure 3A:
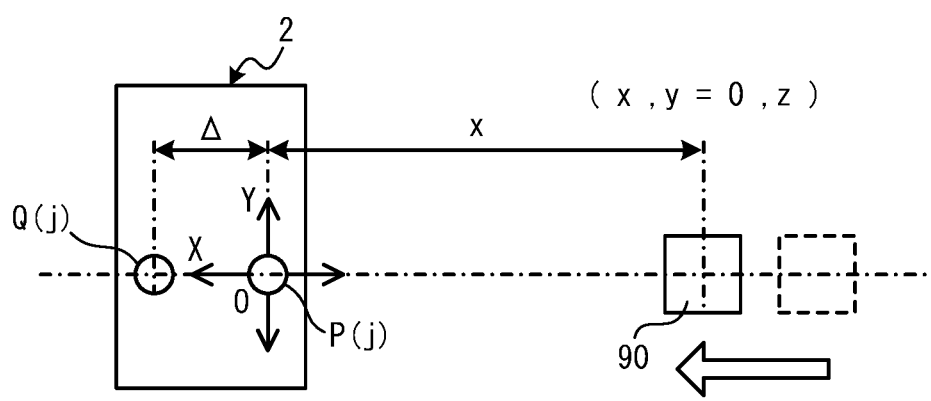
FIG. 3A is a plan view of a positional relationship between a sensor and a magnetic body.
Figure 3B:
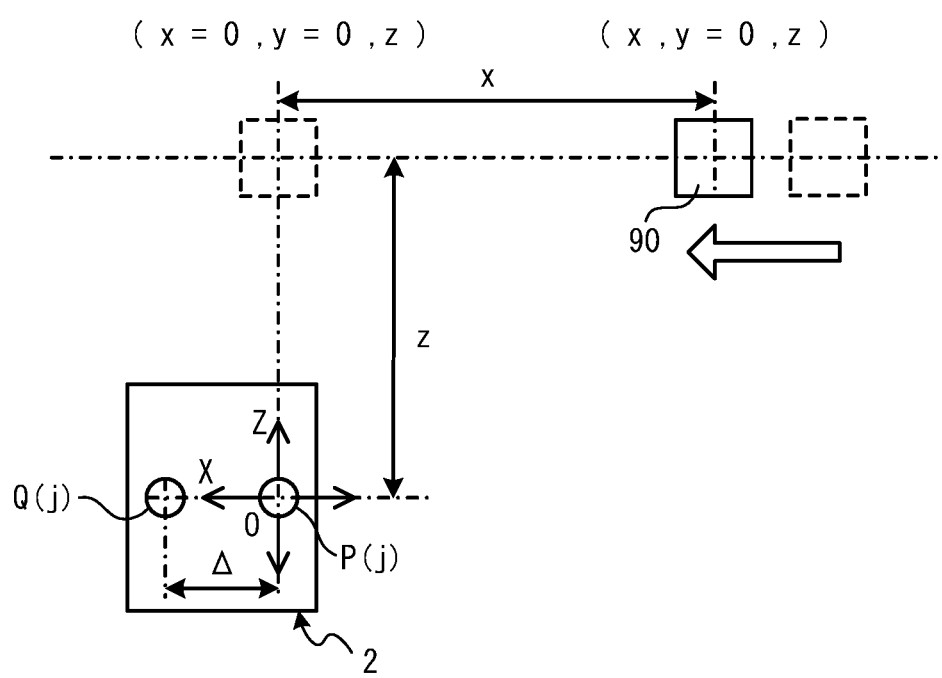
FIG. 3B is a side view of a positional relationship between a sensor and a magnetic body.

As illustrated in FIG. 3A, an origin point O of a coordinate system for indicating the position of the magnetic body 90 is a position of the target sensor (the magnetic sensor P(j)). It is assumed that the magnetic body 90 is at coordinates (x, y, z) separated from the origin point O by a distance x in the X-direction, a distance y in the Y-direction, and a distance z in the Z-direction. Of the magnetic sensors P(1), P(2), ... P(n), the magnetic sensor P for which the distance to the magnetic body 90 is shortest in the Y-direction is the magnetic sensor P(j). In the present embodiment, it is assumed that the distance y is 0 (y=0). As illustrated in FIG. 3B, when the magnetic body 90 moving along the X-direction comes closest to the magnetic sensor P(j), the distance x becomes 0 (x=0). The position of the magnetic body 90 when the distance x is 0 (x=0) and the distance y is 0 (y=0) is defined as a "closest proximity position".

Attitude Angle

Figure 4:
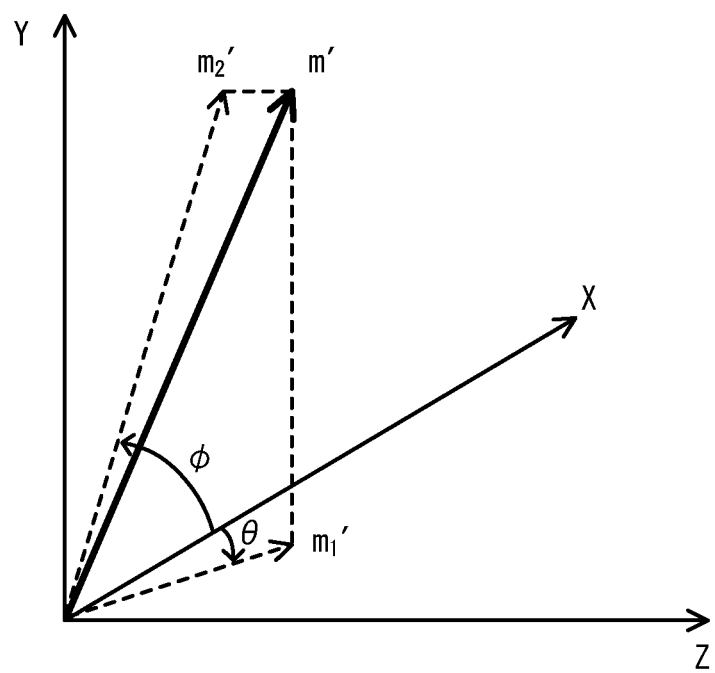
FIG. 4 is a diagram showing an attitude angle of a magnetic moment of the magnetic body.

The magnetic body 90 moves in the X-direction at a predetermined attitude. The magnetic body 90 is inclined at a rotation angle $\theta$ with respect to the Y-direction as an axis and at a rotation angle $\varphi$ with respect to the Z-direction as an axis. An attitude inclined at the rotation angles $\theta$ and $\varphi$ is referred to as an attitude angle. In the present embodiment, as illustrated in FIG. 4, the attitude angle of the magnetic moment of the magnetic body 90 is substantially equal to the attitude angle of the magnetic body 90. A magnetic moment vector is denoted by m'. A component of the magnetic moment vector m' projected on the XY plane (hereinafter referred to as a "magnetic moment XY component") is denoted by $m_1'$. A component of the magnetic moment vector m' projected on the XZ plane (hereinafter referred to as a "magnetic moment XZ component") is denoted by $m_2'$.

Method for Estimating Position of Magnetic Body 90

A method for estimating the position of the magnetic body 90 will be described. A magnetic field distribution of a three-dimensional space generated by the magnetic moment of the magnetic body 90 is expressed by Formula (1). Note that a magnetic flux density vector generated by the magnetic moment of the magnetic body 90 is denoted by B. A distance vector from the magnetic moment of the magnetic body 90 is denoted by r'. The magnitude of the distance vector r' (hereinafter referred to as a "distance from the magnetic moment of the magnetic body 90") is denoted by r.

[Formula 1]

$$B = -\frac{\mu_0}{4\pi}\left[\frac{\frac{m'}{r^3} - 3(m' \cdot r')r'}{r^5}\right] \quad (1)$$

It is assumed that the origin point O of the coordinate system is the position of the target sensor, and the magnetic body 90 is at the coordinates (x, y, z) separated from the origin point O by the distance x in the X-direction, the distance y in the Y-direction, and the distance z in the Z-direction. As described above, the distance y, which is the distance between the magnetic body 90 and the target sensor in the Y-direction, is 0 (y=0). A case is assumed in which the magnetic body 90 is at the coordinates (x, 0, z). Of the magnetic field distribution generated by the magnetic moment XY component $m_1'$, the magnitude of the X-direction component and the magnitude of the Y-direction component are expressed by Formulas (2) and (3), respectively. Note that the magnitude of the X-direction component of the magnetic flux density vector B detected by the target sensor is denoted by Bx. The magnitude of the Y-direction component of the magnetic flux density vector B detected by the target sensor is denoted by $B_Y$. The magnitude of the magnetic moment XY component $m_1'$ is denoted by $m_1$. The magnetic moment XY component $m_1'$ is equal to $m_1$ (cos θ, sin θ, 0) ($m_1'=m_1$ (cos θ, sin θ, 0)), and the distance r from the magnetic moment of the magnetic body 90 to the target sensor is equal to $(x^2+z^2)^{1/2}$ ($r=(x^2+z^2)^{1/2}$).

[Formula 2]

$$B_X = -m_1 \frac{\mu_0}{4\pi} \left[ \frac{\cos\theta}{r^3} - \frac{3x^2 \cos\theta}{r^5} \right] \quad (2)$$

[Formula 3]

$$B_Y = -m_1 \frac{\mu_0}{4\pi} \left[ \frac{\sin\theta}{r^3} \right] \quad (3)$$

Based on Formula (2), the magnitude $B_X$ of the X-direction component of the magnetic flux density vector B becomes largest when the magnetic body 90 is at the closest proximity position (coordinates (0, 0, z)). Based on Formulas (2) and (3), the magnitude of the X-direction component and the magnitude of the Y-direction component of the magnetic flux density vector B when the magnetic body 90 is at the closest proximity position are expressed by Formulas (4) and (5), respectively. The magnitude of the X-direction component of the magnetic flux density vector B detected by the target sensor when the magnetic body 90 is at the closest proximity position is denoted by $B_{X0}$. The magnitude of the Y-direction component of the magnetic flux density vector B detected by the target sensor when the magnetic body 90 is at the closest proximity position is denoted by $B_{Y0}$.

[Formula 4]

$$B_{X0} = -m_1 \frac{\mu_0}{4\pi} \frac{\cos\theta}{z^3} \quad (4)$$

[Formula 5]

$$B_{Y0} = -m_1 \frac{\mu_0}{4\pi} \frac{\sin\theta}{z^3} \quad (5)$$

Based on Formulas (2) and (4), when $B_X$ is normalized using $B_{X0}$, $B_X$ and $B_{X0}$ are expressed by Formula (6).

[Formula 6]

$$\frac{B_X}{B_{X0}} = \left[ \frac{z^3}{(z^2+x^2)^{3/2}} - \frac{3z^3 x^2}{(z^2+x^2)^{5/2}} \right] \quad (6)$$

A position (coordinates (Δ, 0, z)) of the magnetic body 90 separated from the closest proximity position (coordinates (0, 0, z)) in the X-direction by the distance Δ is referred to as a predetermined position. The distance r from the magnetic moment of the magnetic body 90 located at the predetermined position is equal to $(Δ^2+z^2)^{1/2}$ ($r(Δ^2+z^2)^{1/2}$).

The X-direction component of the magnetic flux density vector B when the magnetic body 90 is at the predetermined position is denoted by $B_{XΔ}$. $B_{XΔ}/B_{X0}$ obtained by normalizing $B_{XΔ}$ using $B_{X0}$ is denoted by R. By ignoring the second term in the right side of Formula (6), as it is extremely small compared with the first term in the right side of the formula, the distance z is expressed by Formula (7).

[Formula 7]

$$z = \frac{\Delta R^{1/3}}{(1-R^{2/3})^{1/2}} \quad (7)$$

Further, the distance z can be determined by a method other than the calculation using Formula (7). For example, the distance z can also be determined by trigonometry, namely, by calculating an angle formed between a vector $B_0$, which is the magnetic flux density vector when the magnetic body 90 is at the closest proximity position, and a vector $B_Δ$, which is the magnetic flux density vector when the magnetic body 90 is at the predetermined position.

When the magnitude of the distance Δ is known based on Formula (7) and the like, the distance z can be estimated based on the X-direction component $B_{X0}$ of the magnetic flux density vector B when the magnetic body 90 is at the closest proximity position, and the X-direction component $B_{XΔ}$ of the magnetic flux density vector when the magnetic body 90 is at the predetermined position. Note that, although a description thereof is omitted herein, the same result, namely, Formula (7) can be obtained by a similar method using a magnetic flux density vector generated by the magnetic moment XZ component $m_2'$.

Method for Determining Distance Δ

Three methods for determining the distance Δ will be described as examples. The first method is as follows. Two magnetic sensors that can measure the X-direction component of a magnetic field are disposed side by side in the X-direction. At this time, an interval between the two magnetic sensors in the X-direction is the magnitude of the distance Δ. When the magnetic body 90 is at the closest proximity position with respect to one of the two magnetic sensors, the measurement value of the one of the two magnetic sensors indicates $B_{X0}$. At this time, the magnetic body 90 is at the predetermined position with respect to the other of the two magnetic sensors. The measurement value of the other of the two magnetic sensors is $B_{XΔ}$. Thus, based on Formula (7) and the like, the distance z can be estimated.

The second method is as follows. Two magnetic sensors that can measure the X-direction component of a magnetic field are disposed side by side in the X-direction. Changes over time in the measurement values of each of the two magnetic sensors are stored. A moving velocity of the magnetic body 90 is estimated based on a time difference between a timing at which the measurement value of one of the two magnetic sensors indicates a maximum value and a timing at which the measurement value of the other of the two magnetic sensors indicates a maximum value. The position of the magnetic body 90 obtained when a predetermined time period has elapsed after the measurement value of the one of the two magnetic sensors indicates the maximum value is determined as the predetermined position, and the distance Δ is determined based on the predetermined time period and the estimated moving velocity of the magnetic body 90. As a result, the distance z can be estimated, using Formula (7) and the like, based on $B_{X0}$ and $B_{X\Delta}$, where $B_{X0}$ is the maximum value of the one of the two magnetic sensors, and $B_{X\Delta}$ is the measurement value of the one of the two magnetic sensors after the predetermined time has elapsed from when $B_{X0}$ is indicated.

The third method is as follows. Two photo interrupters are disposed side by side in the X-direction so as to surround a magnetic sensor that can measure the X-direction component of a magnetic field. The photo interrupter is provided with a light-emitting portion and a light-receiving portion that are disposed facing each other. When the magnetic body 90 moving in the X-direction passes between the light-emitting portion and the light-receiving portion, the photo interrupter outputs a signal. The moving velocity of the magnetic body 90 is estimated based on a time difference between a timing at which one of the two photo interrupters outputs the signal and a timing at which the other of the two photo interrupters outputs the signal. Changes over time in the measurement values of the magnetic sensor are stored. The position of the magnetic body 90 obtained when a predetermined time period has elapsed from when the measurement value of the magnetic sensor indicates the maximum value is determined as the predetermined position, and the distance $\Delta$ is determined based on the predetermined time period and the estimated moving velocity of the magnetic body 90. As a result, the distance z can be estimated using Formula (7) and the like, based on $B_{X0}$ and $B_{X\Delta}$, where $B_{X0}$ is the maximum value of the magnetic sensor, and $B_{X\Delta}$ is the measurement value of the magnetic sensor after the predetermined time has elapsed from when $B_{X0}$ is indicated.

Method for Estimating Magnitude of Magnetic Moment Based on Distance z

A method for estimating the magnitude of the magnetic moment vector m' will be described. The magnitude of the magnetic moment vector m' will be simply referred to as the magnitude of the magnetic moment below. When, for the attitude angle, θ is 90 degrees and φ is 0 degrees (θ=90 degrees and φ=0 degrees), based on Formula (1), an angle formed between the magnetic moment vector m' and the distance vector r' is 90 degrees. Thus, the magnetic flux density vector B is expressed by Formula (8).

[Formula 8]

$$B = -\frac{\mu_0}{4\pi}\left[\frac{m'}{r^3}\right] \quad (8)$$

In Formula 8, when the magnetic body 90 is at the closest proximity position, r is equal to z (r=z). In this case, if the respective magnitudes of the X-direction component, the Y-direction component, and the Z-direction component of the magnetic flux density vector B can be identified based on Formula (8), the respective magnitudes of the X-direction component, the Y-direction component, and the Z-direction component of the magnetic moment vector m' can be estimated. Based on the magnitudes of each of the components of the magnetic moment vector m', the magnitude of the magnetic moment can be estimated. For example, the magnitude of the magnetic moment can be estimated from a square root value of the sum of squares of the respective magnitudes of each of the components of the magnetic moment vector m'.

Method for Estimating Attitude Angle

In Formula (8), θ=90 degrees and φ=0 degrees, but the attitude angle of the magnetic moment of the magnetic body 90 is not limited to this example. A method for estimating the attitude angle of the magnetic moment will be described.

When the magnetic body 90 is at the closest proximity position, the rotation angle θ, which is a component of the attitude angle, is expressed by Formula (9) based on Formulas (4) and (5).

[Formula 9]

$$\theta = \arctan\left(\frac{B_{Y0}}{B_{X0}}\right) \quad (9)$$

The rotation angle φ, which is a component of the attitude angle, is also estimated in the same manner. Of the magnetic field distribution of the three-dimensional space generated by the magnetic moment XZ component $m_2'$ of the magnetic body 90, the magnitude of the X-direction component and the magnitude of the Z-direction component are expressed by Formulas (10) and (11), respectively. Note that the magnitude of the Z-direction component of the magnetic flux density vector B detected by the target sensor is denoted by $B_Z$. The magnitude of the magnetic moment XZ component $m_2'$ is denoted by $m_2$. The magnetic moment XZ component $m_2'$ is equal to $m_2$ (cos φ, 0, sin φ) ($m_2'$=$m_2$ (cos φ, 0, sin φ)).

[Formula 10]

$$B_X = -m_2\frac{\mu_0}{4\pi}\left[\frac{\cos\phi}{r^3} - \frac{3x(x\cos\phi + z\sin\phi)}{r^5}\right] \quad (10)$$

[Formula 11]

$$B_Z = -m_2\frac{\mu_0}{4\pi}\left[\frac{\sin\phi}{r^3} - \frac{3z(x\cos\phi + z\sin\phi)}{r^5}\right] \quad (11)$$

Based on Formula (10), $B_X$ is largest when the magnetic body 90 is at the closest proximity position. The magnitude of the X-direction component and the magnitude of the Z-direction component, of the magnetic flux density vector B when the magnetic body 90 is at the closest proximity position are expressed by Formulas (12) and (13), respectively, based on Formulas (10) and (11). The magnitude of the Z-direction component of the magnetic flux density vector B detected by the target sensor when the magnetic body 90 is at the closest proximity position is denoted by $B_{Z0}$.

[Formula 12]

$$B_{X0} = -m_2\frac{\mu_0}{4\pi}\left[\frac{\cos\phi}{z^3}\right] \quad (12)$$

[Formula 13]

$$B_{Z0} = m_2\frac{\mu_0}{4\pi}\left[\frac{2\sin\phi}{z^3}\right] \quad (13)$$

When the magnetic body 90 is at the closest proximity position, the distance r from the magnetic moment of the magnetic body 90 is equal to z (r=z). Thus, the rotation angle φ, which is the component of the attitude angle, is expressed by Formula (14) based on Formulas (12) and (13).

[Formula 14]

$$\phi = \arctan\left(-\frac{1}{2}\frac{B_{Z0}}{B_{X0}}\right) \quad (14)$$

Method for Estimating Magnitude $m_1$ of Magnetic Moment XY Component

A method for estimating a magnitude $m_1$ of the magnetic moment XY component will be described. Based on Formulas (4) and (5), when the magnetic body 90 is at the closest proximity position, respective absolute values of the magnitude $B_{X0}$ of the X-direction component and the magnitude $B_{Y0}$ of the Y-direction component of the magnetic flux density vector B are expressed by Formulas (15) and (16).

[Formula 15]

$$\mathrm{abs}(B_{X0}) = m_1 \frac{\mu_0}{4\pi}\frac{1}{z^3}\mathrm{abs}(\cos\theta) \quad (15)$$

[Formula 16]

$$\mathrm{abs}(B_{Y0}) = m_1 \frac{\mu_0}{4\pi}\frac{1}{z^3}\mathrm{abs}(\sin\theta) \quad (16)$$

When a is $\mathrm{abs}(\tan\theta)$ ($a=\mathrm{abs}(\tan\theta)$), respective absolute values of $\cos\theta$ and $\sin\theta$ are expressed by Formulas (17) and (18).

[Formula 17]

$$\mathrm{abs}(\cos\theta) = \left(\frac{1}{1+a^2}\right)^{1/2} \quad (17)$$

[Formula 18]

$$\mathrm{abs}(\sin\theta) = \left(\frac{a^2}{1+a^2}\right)^{1/2} \quad (18)$$

The magnitude $m_1$ of the magnetic moment XY component can be estimated by Formula (15) or Formula (16) based on the distance z estimated by Formula (7) and the like and the rotation angle $\theta$ estimated by Formula (9). In the present embodiment, of Formulas (15) and (16), whichever has a higher estimation accuracy is used to estimate the magnitude $m_1$ of the magnetic moment XY component. Formulas (15) and (16) are different from each other in terms of whether $\mathrm{abs}(\cos\theta)$ or $\mathrm{abs}(\sin\theta)$ is used in the formula. By estimating the magnitude $m_1$ of the magnetic moment XY component based on the larger of $\mathrm{abs}(\cos\theta)$ and $\mathrm{abs}(\sin\theta)$, the magnitude $m_1$ of the magnetic moment XY component can be accurately estimated.

When $\mathrm{abs}(\sin\theta)$ is smaller than $\mathrm{abs}(\cos\theta)$ ($\mathrm{abs}(\sin\theta)<\mathrm{abs}(\cos\theta)$), the magnitude $m_1$ of the magnetic moment XY component is expressed by Formula (19) based on Formulas (15) and (17).

[Formula 19]

$$m_1 \propto z^3(1+a^2)^{1/2}\mathrm{abs}(B_{X0}) \quad (19)$$

When $\mathrm{abs}(\cos\theta)$ is smaller than $\mathrm{abs}(\sin\theta)$ ($\mathrm{abs}(\cos\theta)<\mathrm{abs}(\sin\theta)$), the magnitude $m_1$ of the magnetic moment XY component is expressed by Formula (20) based on Formulas (16) and (18).

[Formula 20]

$$m_1 \propto z^3\left(\frac{1+a^2}{a^2}\right)^{1/2}\mathrm{abs}(B_{Y0}) \quad (20)$$

Method for Estimating Magnitude $m_2$ of Magnetic Moment XZ Component

A method for estimating a magnitude $m_2$ of the magnetic moment XZ component will be described. Based on Formulas (12) and (13), when the magnetic body 90 is at the closest proximity position, respective absolute values of the magnitude $B_{X0}$ of the X-direction component and the magnitude $B_{Z0}$ of the Z-direction component of the magnetic flux density vector B are expressed by Formulas (21) and (22).

[Formula 21]

$$\mathrm{abs}(B_{X0}) = m_2 \frac{\mu_0}{4\pi}\frac{1}{z^3}\mathrm{abs}(\cos\phi) \quad (21)$$

[Formula 22]

$$\mathrm{abs}(B_{Z0}) = m_2 \frac{\mu_0}{4\pi}\frac{1}{z^3}\mathrm{abs}(\sin\phi) \quad (22)$$

When b is $\mathrm{abs}(\tan\phi)$ ($b=\mathrm{abs}(\tan\phi)$), respective absolute values of $\cos\phi$ and $\sin\phi$ are expressed by Formulas (23) and (24).

[Formula 23]

$$\mathrm{abs}(\cos\phi) = \left(\frac{4}{4+b^2}\right)^{1/2} \quad (23)$$

[Formula 24]

$$\mathrm{abs}(\sin\phi) = \left(\frac{4}{4+b^2}\right)^{1/2} \quad (24)$$

The magnitude $m_2$ of the magnetic moment XZ component can be estimated by Formula (21) or Formula (22) based on the distance z estimated by Formula (7) and the like and the rotation angle $\phi$ estimated by Formula (14). In the same manner as when the magnitude $m_1$ of the magnetic moment XY component is estimated, by estimating the magnitude $m_2$ of the magnetic moment XZ component based on the larger of $\mathrm{abs}(\cos\phi)$ and $\mathrm{abs}(\sin\phi)$, the magnitude $m_2$ of the magnetic moment XZ component can be accurately estimated.

When $\mathrm{abs}(\sin\phi)$ is smaller than $\mathrm{abs}(\cos\phi)$ ($\mathrm{abs}(\sin\phi)<\mathrm{abs}(\cos\phi)$), the magnitude $m_2$ of the magnetic moment XZ component is expressed by Formula (25) based on Formulas (21) and (23).

[Formula 25]

$$m_2 \propto z^3\left(\frac{4+b^2}{4}\right)^{1/2}\mathrm{abs}(B_{X0}) \quad (25)$$

When $\mathrm{abs}(\cos\phi)$ is smaller than $\mathrm{abs}(\sin\phi)$ ($\mathrm{abs}(\cos\phi)<\mathrm{abs}(\sin\phi)$), the magnitude $m_2$ of the magnetic moment XZ component is expressed by Formula (26) based on Formulas (22) and (24).

[Formula 26]

$$m_2 \propto \frac{1}{2}z^3 \left(\frac{4+b^2}{b^2}\right)^{1/2} \text{abs}(B_{Z0}) \qquad (26)$$

Method for Estimating Magnitude of Magnetic Moment Taking Attitude Angle into Account A method for estimating the magnitude of the magnetic moment of the magnetic body 90 will be described. The magnitude of the magnetic moment is denoted by m. The magnitude m of the magnetic moment is a value obtained by combining the magnitude $m_1$ of the magnetic moment XY component and the magnitude $m_2$ of the magnetic moment XZ component. The magnitude m of the magnetic moment is expressed by Formula (27).

[Formula 27]

$$m = (m_1^2 + m_2^2)^{1/2} \qquad (27)$$

Main Processing

Figure 5:
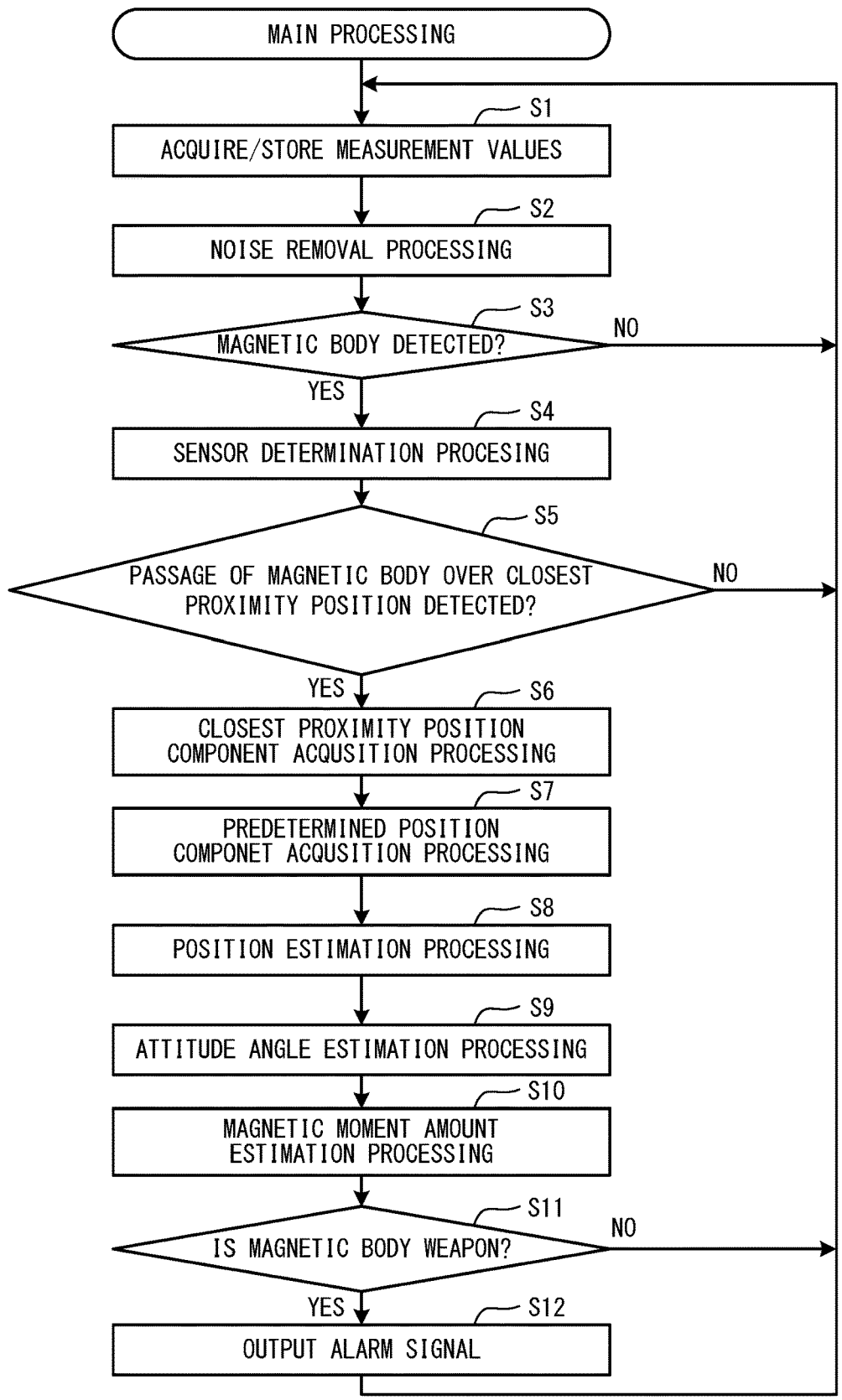
FIG. 5 is a flowchart of main processing.

With reference to FIG. 5, the main processing will be described. When an instruction to start estimating the position of the magnetic body 90 and the magnitude of the magnetic moment of the magnetic body 90 is input to the magnetic detector 1, the main processing is started by the CPU 11 executing the program stored in the storage 14.

The CPU 11 repeatedly acquires the measurement values detected by the magnetic sensors P and Q, respectively, at a predetermined cycle, and stores the acquired measurement values in the RAM 13 (step S1). Each of the measurement values includes a measurement value of the X-direction, a measurement value of the Y-direction, and a measurement value of the Z-direction. The CPU 11 performs noise removal processing on the plurality of measurement values stored in the RAM 13 (step S2). The noise removal processing is processing for removing an environmental magnetic field included in the plurality of measurement values that is generated by an object other than the magnetic body 90. In the present embodiment, in the noise removal processing, a low pass filter and a high pass filter are used to remove the environmental magnetic field.

The CPU 11 determines whether the magnetic body 90 is detected (step S3). At step S3, the CPU 11 determines whether any one of the plurality of measurement values, from which the environmental magnetic field has been removed at step S2, is equal to or greater than a threshold value set in advance. Hereinafter, the plurality of measurement values from which the environmental magnetic field has been removed at step S2 will be referred to as a "plurality of analysis values". Each of the analysis values includes an analysis value of the X-direction corresponding to the measurement value of the X-direction, an analysis value of the Y-direction corresponding to the measurement value of the Y-direction, and an analysis value of the Z-direction corresponding to the measurement value of the Y-direction. When the plurality of analysis values corresponding to the magnetic sensors P and Q are all smaller than the threshold value, the CPU 11 determines that the magnetic body 90 is not detected (no at step S3), and returns the processing to step S1. When any one of the plurality of analysis values corresponding to the magnetic sensors P and Q is equal to or greater than the threshold value, the CPU 11 determines that the magnetic body 90 is detected (yes at step S3), and transitions the processing to step S4.

The CPU 11 performs sensor determination processing (step S4). At step S4, the CPU 11 determines the target sensor and the compensation sensor from among the magnetic sensors P and Q. Among the magnetic sensors P(1), P(2), . . . P(n), the CPU 11 selects the magnetic sensor P for which an absolute value of the analysis value of the Y-direction is largest. When the magnetic sensor P for which the absolute value of the analysis value of the Y-direction is largest is the magnetic sensor P(j), the magnitudes of the absolute values of the analysis values of the X-direction of the magnetic sensor P(j) and the magnetic sensor Q(j) are compared. Of the magnetic sensor P(j) and the magnetic sensor Q(j), the CPU 11 determines the magnetic sensor for which the absolute value of the analysis value of the X-direction is larger as the target sensor, and determines the magnetic sensor for which the absolute value of the analysis value of the X-direction is smaller as the compensation sensor.

Figure 6:
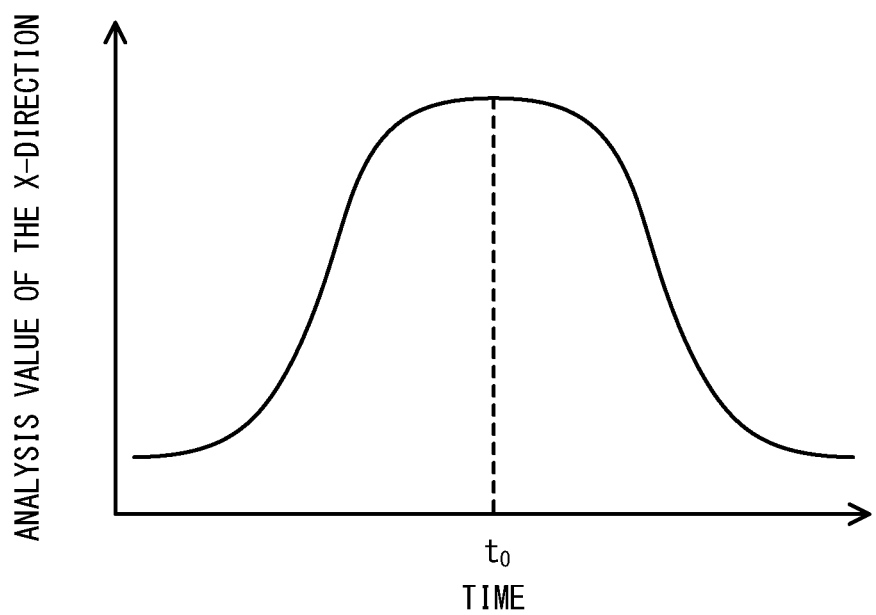
FIG. 6 is a diagram showing, in absolute values, changes over time of an X-direction component of a magnetic field acquired at a predetermined cycle.

The CPU 11 determines whether the magnetic body 90 has passed the closest proximity position with respect to the target sensor (step S5). Based on Formulas (2) and (10), when the magnetic body 90 is at the closest proximity position, the absolute value of the X-direction component of the magnetic field generated by the magnetic body 90 is largest. In other words, when the magnetic body 90 is at the closest proximity position, the absolute value of the analysis value of the X-direction is largest. FIG. 6 is a graph showing changes over time in the absolute value of the analysis value of the X-direction detected by the target sensor. In the graph, a timing at which the absolute value of the analysis value of the X-direction becomes a maximum value is a timing to at which the magnetic body 90 is located at the closest proximity position. When the maximum value is not found in the changes over time in the absolute value of the analysis value of the X-direction detected by the target sensor, the CPU 11 determines that the magnetic body 90 has not passed the closest proximity position (no at step S5), and returns the processing to step S1. When the maximum value is found in the changes over time in the absolute value of the analysis value of the X-direction detected by the target sensor, the CPU 11 determines that the magnetic body 90 has passed the closest proximity position (yes at step S5), and transitions the processing to step S6.

The CPU 11 performs closest proximity position component acquisition processing (step S6). In the closest proximity position component acquisition processing, the analysis value detected by the target sensor at the timing (timing to) at which the magnetic body 90 is at the closest proximity position is acquired. The CPU 11 transitions the processing to step S7.

The CPU 11 performs predetermined position component acquisition processing (step S7). In the predetermined position component acquisition processing, the analysis value detected by the compensation sensor when the magnetic body 90 is at the predetermined position with respect to the compensation sensor is acquired. The target sensor and the compensation sensor are disposed so as to be separated in the X-direction by the distance Δ. When the target sensor detects the closest proximity position component, using the above-described first method for determining the distance Δ, the magnetic body 90 is at the predetermined position with respect to the compensation sensor. In other words, in the predetermined position component acquisition processing (step S7), the analysis value detected by the compensation sensor at the timing to is acquired. The CPU 11 transitions the processing to step S8.

The CPU 11 performs position estimation processing (step S8). In the position estimation processing, the analysis value of the X-direction of the closest proximity position component acquired at step S6, the analysis value of the X-direction of the predetermined position component acquired at step S7, and the distance Δ stored in the ROM 12 are substituted into Formula (6). The CPU 11 rearranges Formula (6) into which each of the values has been substituted, and derives Formula (7). In this way, the CPU 11 estimates the distance z. The CPU 11 transitions the processing to step S9. Further, the distance z may also be estimated using the above-described trigonometry.

The CPU 11 performs attitude angle estimation processing (step S9). In the attitude angle estimation processing, two values among the analysis value of the X-direction, the analysis value of the Y-direction, and the analysis value of the Z-direction of the closest proximity position component acquired at step S6 are substituted into Formulas (9) and (14). In this way, the CPU 11 estimates the rotation angles θ and φ, respectively. The CPU 11 transitions the processing to step S10.

The CPU 11 performs magnetic moment amount estimation processing (step S10). In the magnetic moment amount estimation processing, the following processing is performed. The analysis value of the X-direction and the analysis value of the Y-direction of the closest proximity position component acquired at step S6, the distance z estimated at step S8, and the rotation angle θ estimated at step S9 are substituted into Formulas (15) to (18). From Formulas (15) to (18) into which each of the values is substituted, Formulas (19) and (20) are derived. Based on the rotation angle θ, from one of Formulas (19) and (20), the magnitude $m_1$ of the magnetic moment XY component is estimated. The analysis value of the X-direction and the analysis value of the Z-direction of the closest proximity position component acquired at step S6, the distance z estimated at step S8, and the rotation angle φ estimated at step S9 are substituted into Formulas (21) to (24). From Formulas (21) to (24) into which each of the values is substituted, Formulas (25) and (26) are derived. Based on the rotation angle φ, from one of Formulas (25) and (26), the magnitude $m_2$ of the magnetic moment XZ component is estimated. The estimated magnitude $m_1$ of the magnetic moment XY component and the estimated magnitude $m_2$ of the magnetic moment XZ component are substituted into Formula (27). In this way, the magnitude m of the magnetic moment is estimated.

Based on the estimated magnitude m of the magnetic moment, the CPU 11 determines whether the magnetic body 90 is a weapon (step S11). When the strength of magnetic poles is denoted by q and a distance between the magnetic poles is denoted by d, respectively, the magnitude m of the magnetic moment is expressed as m=qd. The distance d between the magnetic poles of the weapon is larger than the distance d between magnetic poles of an object other than the weapon (a magnet or the like included in daily commodities, for example). Thus, the magnitude m of the magnetic moment of the weapon is larger than the magnitude m of the magnetic moment of the object other than the weapon. At step S11, when the estimated magnitude m of the magnetic moment is equal to or greater than the threshold value set in advance, the CPU 11 determines that the magnetic body 90 is the weapon. At step S11, when the estimated magnitude m of the magnetic moment is smaller than the threshold value set in advance, the CPU 11 determines that the magnetic body 90 is not the weapon.

When it is determined that the magnetic body 90 is not the weapon (no at step S11), the CPU 11 returns the processing to step S1. When it is determined that the magnetic body 90 is the weapon (yes at step S11), the CPU 11 outputs an alarm signal (step S12). The alarm signal is output to the PC 20, the alarm lamp 30, the monitoring camera 40, and the like via the display 6 and the communication I/F 15. In response to the reception of the alarm signal, the display 6 is lit or caused to flash on and off. In response to the reception of the alarm signal, the PC 20 displays, on the display 21, a notification screen that notifies that a weapon is present in the vicinity of the magnetic detector 1, for example. In response to the reception of the alarm signal, the alarm lamp 30 is caused to flash on and off. In response to the reception of the alarm signal, the monitoring camera 40 captures an image of the position estimated at step S8, for example. The CPU 11 returns the processing to step S1. The CPU 11 repeatedly performs the processing from step S1 to step S12.

Main Actions and Effects of Present Embodiment

As described above, the magnetic detector 1 is provided with the magnetic sensors P and Q. Each of the magnetic sensors P and Q is the three-axis sensor including the three sensors, and each can selectively measure the magnitude of the X-direction component, the Y-direction component, and the Z-direction component of the magnetic field. The CPU 11 of the magnetic detector 1 detects the timing to at which the magnetic body 90 has passed the closest proximity position with respect to the target sensor (step S5). The CPU 11 respectively acquires the analysis value of the X-direction, the analysis value of the Y-direction, and the analysis value of the Z-direction detected by the target sensor at the timing to (step S6). The CPU 11 acquires the analysis value of the X-direction detected by the compensation sensor at the timing to (step S7). The CPU 11 estimates the distance z based on the analysis value of the X-direction acquired at step S6 and the analysis value of the X-direction acquired at step S7 (step S8). The CPU 11 estimates the magnitude m of the magnetic moment based on one of the analysis value of the X-direction, the analysis value of the Y-direction, or the analysis value of the Z-direction acquired at step S6, and on the distance z estimated at step S8 (step S10). Thus, the magnetic detector 1 can accurately estimate the magnitude m of the magnetic moment of the magnetic body 90.

The CPU 11 respectively estimates the rotation angles θ and φ, which are the components of the attitude angle, based on two of the analysis value of the X-direction, the analysis value of the Y-direction, and the analysis value of the Z-direction acquired at step S6 (step S9). The CPU 11 estimates the magnitude m of the magnetic moment based on one of the analysis value of the X-direction, the analysis value of the Y-direction, or the analysis value of the Z-direction acquired at step S6, on the distance z estimated at step S8, and on at least one of the rotation angle θ or the rotation angle φ estimated at step S9 (step S10). In this case, the magnetic detector 1 estimates the magnitude m of the magnetic moment based on the estimated position and attitude angle of the magnetic body 90. Thus, the magnetic detector 1 can accurately estimate the magnitude m of the magnetic moment of the magnetic body 90.

At step S9, the CPU 11 estimates the rotation angles θ and φ. At step S10, the CPU 11 estimates the magnitude $m_1$ of the magnetic moment XY component based on one of the analysis value of the X-direction and the analysis value of the Y-direction acquired at step S6, on the distance z estimated at step S8, and on the rotation angle θ estimated at step S9. At step S10, the CPU 11 estimates the magnitude $m_2$ of the magnetic moment XZ component based on one of the analysis value of the X-direction and the analysis value of the Z-direction acquired at step S6, on the distance z estimated at step S8, and on the rotation angle φ estimated at step S9. At step S10, the CPU 11 estimates the magnitude m of the magnetic moment based on the estimated magnitude $m_1$ of the magnetic moment XY component and the estimated magnitude $m_2$ of the magnetic moment XZ component.

The CPU 11 determines whether the magnetic body 90 is the weapon based on the estimated magnitude m of the magnetic moment (step S11). In this case, the magnetic detector 1 determines whether the magnetic body 90 is the weapon based on the accurately estimated magnitude of the magnetic moment. Thus, the magnetic detector 1 can accurately determine whether the magnetic body 90 is the weapon.

The magnetic sensor P(j) and the magnetic sensor Q(j) are disposed side by side with the predetermined distance Δ interposed therebetween in the X-direction. When the CPU 11 acquires each of the analysis value of the X-direction, the analysis value of the Y-direction, and the analysis value of the Z-direction detected by the target sensor at the timing t0 (step S6), the CPU 11 acquires the analysis value of the X-direction detected by the compensation sensor at the timing t0 (step S7). In this case, since the predetermined position of the magnetic body 90 with respect to the compensation sensor is determined, the position of the magnetic body 90 can be accurately estimated.

MODIFIED EXAMPLES

The present disclosure is not limited to the above-described embodiment, and various modifications are possible. The magnetic detector 1 may have a structure in which the sensor 2 and the controller 3 are provided as separate portions. In this case, the controller 3 may be a computer system such as a PC or a workstation.

The number of the magnetic sensors P and Q is not limited. The interval between the magnetic sensors P and Q arranged in the Y-direction need not necessarily be the equal interval. The interval between the magnetic sensor P(j) and the magnetic sensor Q(j) need not necessarily be the predetermined distance Δ. The magnetic sensors P and Q are not limited to the MI sensors and may be other magnetic sensors capable of selectively detecting the magnitude of a component of a specific direction of a magnetic field. The magnetic sensors P and Q need not necessarily be the three-axis sensors each including the three sensors, and may be two-axis sensors each including two sensors. One of the magnetic sensors P and Q may be a magnetic sensor capable of measuring only the X-direction component of the magnetic field. In this case, the one of the magnetic sensors P and Q that can measure only the X-direction component of the magnetic field may be used as the compensation sensor, and the other of the magnetic sensors P and Q may be used as the target sensor. When estimating the position of the magnetic body 90 and the magnitude of the magnetic moment, the analysis values of the magnetic sensors P and Q other than the target sensor and the compensation sensor may be referenced.

The directions of the components of the magnetic field that can be measured by the magnetic sensors P and Q need not necessarily be orthogonal to each other. The magnitude of the component of each of the directions of the magnetic field may be detected based on the measurement values of the plurality of sensors constituting the magnetic sensors P and Q. The movement direction of the magnetic body 90 is not limited to the direction along the X-direction, and may be any chosen direction. In this case, the magnetic detector 1 can estimate the position of the magnetic body 90 and the magnitude m of the magnetic moment of the magnetic body 90 based on the component along the X-direction among the movement directions of the magnetic body 90.

It is sufficient that a program including an instruction for performing the main processing be stored in the storage 14 before the CPU 11 executes the program. A method for acquiring the program, an acquisition route of the program, and a device for storing the program may each be changed as appropriate. The program executed by the CPU 11 may be received from another device via a cable or wireless communication, and may be stored in a storage such as a non-volatile memory. The other device includes a server connected to the magnetic detector 1 via the network 99, for example.

Some or all of the steps of the main processing may be performed by another electronic device (an ASIC, for example). Each of the steps of the main processing may be omitted or added, or the order of the steps may be changed as necessary. A mode in which an operating system (OS) or the like operating on the controller 3 performs some or all of the main processing in accordance with instructions from the CPU 11 is also included in the scope of the present disclosure. For example, changes described below may be made to the main processing as appropriate.

Step S2 may be omitted, and the position of the magnetic body 90 and the magnitude of the magnetic moment of the magnetic body 90 may be estimated from the measurement values detected by the magnetic sensors P and Q. Steps S3 and S4 may be omitted. In this case, of the magnetic sensors that indicate the maximum values at step S5, the magnetic sensor for which the maximum value is largest becomes the target sensor. One of the magnetic sensors P and Q may be decided as the target sensor, and the other as the compensation sensor in advance. In this case, the processing at step S4 is simplified.

At step S5, the method for determining whether the magnetic body 90 has passed the closest proximity position with respect to the target sensor is not limited to the above-described embodiment. For example, the magnetic detector 1 may be provided with a camera capable of capturing a moving image. Whether the magnetic body 90 has passed the closest proximity position may be determined based on a movement trajectory of the magnetic body 90 in the moving image captured by the camera.

The predetermined position component at step S6 may be acquired by another method. For example, the second method or the third method exemplified as the method for determining the distance Δ may be used. In the second method and the third method, the moving velocity of the magnetic body 90 is estimated, and the predetermined position is determined based on the estimated moving velocity. When the third method is used, the magnetic detector 1 is provided with the two photo interrupters for estimating the moving velocity of the magnetic body 90, and need not necessarily be provided with one of the magnetic sensors P and Q. Note that when the third method is used, instead of the two photo interrupters, a laser velocity measurement device or the like may be used to estimate the moving velocity of the magnetic body 90.

The coordinate system is not limited to that of the above-described embodiment. For example, in the Y-direction, the position of the ground may be defined as y=0. At step S8, the distance x or the distance y may be estimated instead of the distance z. For example, the moving velocity of the magnetic body 90 may be estimated by the second method or the third method exemplified above as the method for determining the distance Δ, and the distance x may be estimated based on the estimated moving velocity. For example, when the magnetic detector 1 is installed on the ground, information about the heights of the respective magnetic sensors from the ground may be stored in advance in the ROM 12. The distance y may be estimated based on the information about the heights of the target sensors from the ground. Information about the distances x, y, and z may be included in the alarm signal output at step S12. In this case, for example, information about the position of the magnetic body 90 may be displayed on the display 21 of the PC 20, and an image of the estimated position of the magnetic body 90 may be captured by the monitoring camera 40.

At step S9, only one of the rotation angles θ and φ may be estimated. At step S10, only one of the magnitude $m_1$ of the magnetic moment XY component and the magnitude $m_2$ of the magnetic moment XZ component may be estimated. Further, at step S10, the magnitude m of the magnetic moment may be estimated using Formula (8) based on the closest proximity position component acquired when the magnetic body 90 is at the closest proximity position (r=z). In this case, step S9 may be omitted. The method for estimating the magnitude m of the magnetic moment is not limited to that of the above-described embodiment. For example, the larger of the magnitude $m_1$ of the magnetic moment XY component and the magnitude $m_2$ of the magnetic moment XZ component may be determined as the magnitude m of the magnetic moment. The arithmetic mean or the geometric mean of the magnitude $m_1$ of the magnetic moment XY component and the magnitude $m_2$ of the magnetic moment XZ component may be determined as the magnitude m of the magnetic moment. Steps S11 or S12 may be omitted.

The apparatus and methods described above with reference to the various embodiments are merely examples. It goes without saying that they are not confined to the depicted embodiments. While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying principles.

What is claimed is:

1. A magnetic detector configured to detect a magnetic field formed by a magnetic moment of a magnetic body moving in a first direction among the first direction, a second direction, and a third direction, the first direction being a specific direction, and the second direction and the third direction intersecting the first direction, the magnetic detector comprising:
    a first magnetic sensor configured to measure a first magnetic field component, the first magnetic field component being a component of the first direction of the magnetic field;
    a second magnetic sensor disposed in close proximity to or integrated with the first magnetic sensor, and configured to measure a possible magnetic field component including at least one of a second magnetic field component or a third magnetic field component, the second magnetic field component being a component of the second direction of the magnetic field, and the third magnetic field component being a component of the third direction of the magnetic field;
    a processor; and
    a memory configured to store a program executed by the processor, wherein
    the program stored in the memory, when executed by the processor, instructs the processor to perform processes comprising:
        closest proximity detection processing of detecting a timing at which the magnetic body passes a closest proximity position, the closest proximity position being a position of the magnetic body when the magnetic body moving in the first direction is in closest proximity to the first magnetic sensor;
        closest proximity position component acquisition processing of acquiring the first magnetic field component measured by the first magnetic sensor at the timing and the possible magnetic field component measured by the second magnetic sensor;
        predetermined position component acquisition processing of acquiring the first magnetic field component measured by the first magnetic sensor when the magnetic body is at a predetermined position separated by a predetermined distance from the first magnetic sensor;
        distance estimation processing of estimating a third direction distance based on the first magnetic field component acquired by each of the closest proximity position component acquisition processing and the predetermined position component acquisition processing, the third direction distance being a distance between the magnetic body and the first magnetic sensor in the third direction; and
        magnetic moment amount estimation processing of estimating a magnitude of the magnetic moment, based on the third direction distance estimated by the distance estimation processing, and on at least one of the first magnetic field component or the possible magnetic field component acquired by the closest proximity position component acquisition processing.

2. The magnetic detector according to claim 1, wherein the program stored in the memory further instructs the processor to perform a process comprising:
    attitude angle estimation processing of estimating an attitude angle of the magnetic moment, based on the first magnetic field component and the possible magnetic field component acquired by the closest proximity position component acquisition processing, and
    the magnetic moment amount estimation processing further includes estimating the magnitude of the magnetic moment based on the attitude angle estimated by the attitude angle estimation processing.

3. The magnetic detector according to claim 2, wherein the possible magnetic field component includes the second magnetic field component and the third magnetic field component,
    the attitude angle estimation processing includes
        estimating a first rotation angle based on the first magnetic field component and the second magnetic field component acquired by the closest proximity position component acquisition processing, the first rotation angle being a component of a rotation direction centered about the third direction of the attitude angle, and
        estimating a second rotation angle based on the first magnetic field component and the third magnetic field component acquired by the closest proximity position component acquisition processing, the second rotation angle being a component of a rotation direction centered about the second direction of the attitude angle, and the magnetic moment amount estimation processing includes estimating a first magnetic moment component based on the first rotation angle estimated by the attitude angle estimation processing, on the third direction distance estimated by the distance estimation processing, and on one of the first magnetic field component or the second magnetic field component acquired by the closest proximity position component acquisition processing, the first magnetic moment component being a component projected on a plane including the first direction and the second direction of the magnetic moment, estimating a second magnetic moment component based on the second rotation angle estimated by the attitude angle estimation processing, on the third direction distance estimated by the distance estimation processing, and on one of the first magnetic field component and the third magnetic field component acquired by the closest proximity position component acquisition processing, the second magnetic moment component being a component projected on a plane including the first direction and the third direction of the magnetic moment, and estimating the magnitude of the magnetic moment based on the first magnetic moment component and the second magnetic moment component.

4. The magnetic detector according to claim 1, wherein the program stored in the memory further instructs the processor to perform a process comprising:

weapon determination processing of determining whether the magnetic body is a weapon, when the magnitude of the magnetic moment estimated by the magnetic moment amount estimation processing is equal to or greater than a threshold value set in advance.

5. The magnetic detector according to claim 1, wherein two of the first magnetic sensors are provided, the two first magnetic sensors are provided to be separated from each other by the predetermined distance in the first direction, and the predetermined position acquisition processing includes when the first magnetic field component is measured by one of the first magnetic sensors in the closest proximity position component acquisition processing, acquiring the first magnetic field component measured by the other of the two first magnetic sensors, as the first magnetic field component measured by the first magnetic sensor when the magnetic body is at the predetermined position.

6. The magnetic detector according to claim 1, further comprising:

a velocity estimation portion configured to estimate a moving velocity of the magnetic body in the first direction, and the predetermined position component acquisition processing includes determining the predetermined position based on the moving velocity estimated by the velocity estimation portion and on the first magnetic field component measured by the first magnetic sensor, and acquiring the first magnetic field component measured by the first magnetic sensor when the magnetic body is at the predetermined position.

7. A detection method for estimating a distance between a magnetic body moving in a first direction among the first direction, a second direction, and a third direction and at least one of a first magnetic sensor and a second magnetic sensor, using the first magnetic sensor and the second magnetic sensor, the first direction being a specific direction, the second direction and the third direction intersecting the first direction, and the second magnetic sensor being disposed in close proximity to or integrated with the first magnetic sensor, wherein the first magnetic sensor is configured to measure a first magnetic field component, the first magnetic field component being a component of the first direction of a magnetic field, the second magnetic sensor is configured to measure a possible magnetic field component including at least one of a second magnetic field component or a third magnetic field component, the second magnetic field component being a component of the second direction of the magnetic field, and the third magnetic field component being a component of the third direction of the magnetic field, and the detection method comprises:

a closest proximity detection step of detecting a timing at which the magnetic body passes a closest proximity position, the closest proximity position being a position of the magnetic body when the magnetic body moving in the first direction is in closest proximity to the first magnetic sensor;

a closest proximity position component acquisition step of acquiring the first magnetic field component measured by the first magnetic sensor at the timing and the possible magnetic field component measured by the second magnetic sensor;

a predetermined position component acquisition step of acquiring the first magnetic field component measured by the first magnetic sensor when the magnetic body is at a predetermined position separated by a predetermined distance from the first magnetic sensor;

a distance estimation step of estimating a third direction distance based on the first magnetic field component acquired by each of the closest proximity position component acquisition step and the predetermined position component acquisition step, the third direction distance being a distance between the magnetic body and the first magnetic sensor in the third direction; and a magnetic moment amount estimation step of estimating a magnitude of the magnetic moment, based on the third direction distance estimated by the distance estimation step, and on at least one of the first magnetic field component or the possible magnetic field component acquired by the closest proximity position component acquisition step.

8. The detection method according to claim 7, further comprising:

an attitude angle estimation step of estimating an attitude angle of the magnetic moment, based on the first magnetic field component and the possible magnetic field component acquired by the closest proximity position component acquisition step, wherein the magnetic moment amount estimation step further includes estimating the magnitude of the magnetic moment based on the attitude angle estimated by the attitude angle estimation step.

9. The detection method according to claim 8, wherein the possible magnetic field component includes the second magnetic field component and the third magnetic field component, the attitude angle estimation step includes estimating a first rotation angle based on the first magnetic field component and the second magnetic field component acquired by the closest proximity position component acquisition step, the first rotation angle being a component of a rotation direction centered about the third direction of the attitude angle, and estimating a second rotation angle based on the first magnetic field component and the third magnetic field component acquired by the closest proximity position component acquisition step, the second rotation angle being a component of a rotation direction centered about the second direction of the attitude angle, and the magnetic moment amount estimation step includes estimating a first magnetic moment component based on the first rotation angle estimated by the attitude angle estimation step, on the third direction distance estimated by the distance estimation step, and on one of the first magnetic field component or the second magnetic field component acquired by the closest proximity position component acquisition step, the first magnetic moment component being a component projected on a plane including the first direction and the second direction of the magnetic moment, estimating a second magnetic moment component based on the second rotation angle estimated by the attitude angle estimation step, on the third direction distance estimated by the distance estimation step, and on one of the first magnetic field component and the third magnetic field component acquired by the closest proximity position component acquisition step, the second magnetic moment component being a component projected on a plane including the first direction and the third direction of the magnetic moment, and estimating the magnitude of the magnetic moment based on the first magnetic moment component and the second magnetic moment component.

10. The detection method according to claim 7, further comprising:

a weapon determination step of determining whether the magnetic body is a weapon, when the magnitude of the magnetic moment estimated by the magnetic moment amount estimation step is equal to or greater than a threshold value set in advance.

11. The detection method according to claim 7, wherein the predetermined position component acquisition step includes using two of the first magnetic sensors provided to be separated from each other by the predetermined distance, and when the first magnetic field component is measured by one of the first magnetic sensors at the closest proximity position component acquisition step, acquiring the first magnetic field component measured by the other of the two first magnetic sensors, as the first magnetic field component measured by the first magnetic sensor when the magnetic body is at the predetermined position.

12. The detection method according to claim 7, wherein the predetermined position component acquisition step includes determining the predetermined position based on the moving velocity estimated by the velocity estimation portion and on the first magnetic field component measured by the first magnetic sensor, and acquiring the first magnetic field component measured by the first magnetic sensor when the magnetic body is at the predetermined position.

13. A non-transitory computer readable storage medium storing computer readable instructions that are executed by a processor, the computer readable instructions performing steps comprising:

The steps for estimating a distance between a magnetic body moving in a first direction among the first direction, a second direction, and a third direction and at least one of a first magnetic sensor and a second magnetic sensor, using the first magnetic sensor and the second magnetic sensor, the first direction being a specific direction, the second direction and the third direction intersecting the first direction, and the second magnetic sensor being disposed in close proximity to or integrated with the first magnetic sensor, wherein the first magnetic sensor is configured to measure a first magnetic field component, the first magnetic field component being a component of the first direction of a magnetic field, the second magnetic sensor is configured to measure a possible magnetic field component including at least one of a second magnetic field component or a third magnetic field component, the second magnetic field component being a component of the second direction of the magnetic field, and the third magnetic field component being a component of the third direction of the magnetic field, and the detection method comprises:

a closest proximity detection step of detecting a timing at which the magnetic body passes a closest proximity position, the closest proximity position being a position of the magnetic body when the magnetic body moving in the first direction is in closest proximity to the first magnetic sensor;

a closest proximity position component acquisition step of acquiring the first magnetic field component measured by the first magnetic sensor at the timing and the possible magnetic field component measured by the second magnetic sensor;

a predetermined position component acquisition step of acquiring the first magnetic field component measured by the first magnetic sensor when the magnetic body is at a predetermined position separated by a predetermined distance from the first magnetic sensor;

a distance estimation step of estimating a third direction distance based on the first magnetic field component acquired by each of the closest proximity position component acquisition step and the predetermined position component acquisition step, the third direction distance being a distance between the magnetic body and the first magnetic sensor in the third direction; and a magnetic moment amount estimation step of estimating a magnitude of the magnetic moment, based on the third direction distance estimated by the distance estimation step, and on at least one of the first magnetic field component or the possible magnetic field component acquired by the closest proximity position component acquisition step.

14. The non-transitory computer readable storage medium according to claim 13, further comprising:
an attitude angle estimation step of estimating an attitude angle of the magnetic moment, based on the first magnetic field component and the possible magnetic field component acquired by the closest proximity position component acquisition step, wherein
the magnetic moment amount estimation step further includes estimating the magnitude of the magnetic moment based on the attitude angle estimated by the attitude angle estimation step.

15. The non-transitory computer readable storage medium according to claim 14, wherein
the possible magnetic field component includes the second magnetic field component and the third magnetic field component,
the attitude angle estimation step includes estimating a first rotation angle based on the first magnetic field component and the second magnetic field component acquired by the closest proximity position component acquisition step, the first rotation angle being a component of a rotation direction centered about the third direction of the attitude angle, and
estimating a second rotation angle based on the first magnetic field component and the third magnetic field component acquired by the closest proximity position component acquisition step, the second rotation angle being a component of a rotation direction centered about the second direction of the attitude angle, and
the magnetic moment amount estimation step includes
estimating a first magnetic moment component based on the first rotation angle estimated by the attitude angle estimation step, on the third direction distance estimated by the distance estimation step, and on one of the first magnetic field component or the second magnetic field component acquired by the closest proximity position component acquisition step, the first magnetic moment component being a component projected on a plane including the first direction and the second direction of the magnetic moment,
estimating a second magnetic moment component based on the second rotation angle estimated by the attitude angle estimation step, on the third direction distance estimated by the distance estimation step, and on one of the first magnetic field component and the third magnetic field component acquired by the closest proximity position component acquisition step, the second magnetic moment component being a component projected on a plane including the first direction and the third direction of the magnetic moment, and
estimating the magnitude of the magnetic moment based on the first magnetic moment component and the second magnetic moment component.

16. The non-transitory computer readable storage medium according to claim 13, further comprising:
a weapon determination step of determining whether the magnetic body is a weapon, when the magnitude of the magnetic moment estimated by the magnetic moment amount estimation step is equal to or greater than a threshold value set in advance.

17. The non-transitory computer readable storage medium according to claim 13, wherein
the predetermined position component acquisition step includes
using two of the first magnetic sensors provided to be separated from each other by the predetermined distance, and
when the first magnetic field component is measured by one of the first magnetic sensors at the closest proximity position component acquisition step, acquiring the first magnetic field component measured by the other of the two first magnetic sensors, as the first magnetic field component measured by the first magnetic sensor when the magnetic body is at the predetermined position.

18. The non-transitory computer readable storage medium according to claim 13, wherein
the predetermined position component acquisition step includes
determining the predetermined position based on the moving velocity estimated by the velocity estimation portion and on the first magnetic field component measured by the first magnetic sensor, and
acquiring the first magnetic field component measured by the first magnetic sensor when the magnetic body is at the predetermined position.

* * * * *